United States Patent [19]

Mizushima

[11] Patent Number: 5,045,917
[45] Date of Patent: Sep. 3, 1991

[54] MULTI-LEVEL SEMICONDUCTOR STRUCTURE AND PROCESS OF FABRICATING THEREOF

[75] Inventor: Kazuyuki Mizushima, Tokyo, Japan

[73] Assignee: NEC Corporation, Japan

[21] Appl. No.: 594,645

[22] Filed: Oct. 9, 1990

Related U.S. Application Data

[62] Division of Ser. No. 454,709, Dec. 21, 1989, Pat. No. 4,970,177.

[30] Foreign Application Priority Data

Dec. 25, 1988 [JP] Japan .................... 63-326504

[51] Int. Cl.⁵ .................... H01L 23/48; H01L 29/34
[52] U.S. Cl. .................... 357/71; 357/68; 357/65; 357/54
[58] Field of Search .................... 357/71, 54, 65, 68

[56] References Cited

U.S. PATENT DOCUMENTS 4,696,098 9/1987 Yen .................... 148/51
4,839,311 6/1989 Riley et al. .................... 437/228
4,894,351 1/1990 Batty .................... 437/195

FOREIGN PATENT DOCUMENTS 0261856 10/1988 Japan .................... 437/195

Primary Examiner—Mark Prenty
Attorney, Agent, or Firm—Ostrolenk, Faber, Gerb & Soffen

[57] ABSTRACT

A multi-level semiconductor structure forming a part of a semiconductor device has a narrow wiring strip and a wide wiring strip formed on a lower insulating film, an inter-level insulating film structure covering the narrow and wide wiring strips, an upper insulating film provided on the inter-level insulating film structure and upper metal wiring strips formed on the upper insulating film and contacting respective contact areas of the narrow and wide wiring strips through contact holes formed through the upper insulating film as well as the inter-level insulating film structure, respectively, and the inter-level insulating structure consists of a first film deposited on the entire surface and a second film filling a gap between adjacent lower wiring strips for creating a smooth topography; the second film tends to be left on the wide wiring strip after an etch-back stage and is causative of erosion of the metal wiring strip, so that a plurality of moats are formed in the wide wiring strip for surrounding the contact area, thereby forming a narrow portion where no residual second film is left.

8 Claims, 4 Drawing Sheets

MULTI-LEVEL SEMICONDUCTOR STRUCTURE AND PROCESS OF FABRICATING THEREOF

This is a division of application Ser. No. 07/454,709, filed Dec. 21, 1989 and now U.S. Pat. No. 4,970,177.

FIELD OF THE INVENTION

This invention relates to a semiconductor device formed in a multi-level structure and, more particularly, to an inter-level connection incorporated in the structure of a multi-level semiconductor device and process of fabricating thereof.

DESCRIPTION OF THE RELATED ART

A multi-level structure is desirable for a high density semiconductor device, and inter-level connections are incorporated in the multi-level structure for providing electrical interconnections between component elements on different levels. However, the multi-level connections hardly creates a smooth topography which is beneficial for the subsequent metallization or the wiring strips. In order to achieve the smooth topography as well as improved adhesion, various insulating films produced through coating processes are proposed as a part of or the complete inter-level insulating film. Such a insulating film produced through a coating process is hereinbelow referred to as "coated insulating film", and one of the coating processes is known as the spin-coating.

One of the coated insulating film is formed of an inorganic silicon compound (which is sometimes abbreviated as "SOG"), and Japanese Patent Application laid-open (Kokai) 58-124246 discloses a coated insulating film formed of an organic silicon compound. FIG. 1 shows the structure of a prior art semiconductor device fabricated through a prior art process sequence including a formation stage of the coated insulating film. The prior art process start with preparation of a semiconductor substrate 1, and the lowest insulating film 2 is provided on the major surface of the semiconductor substrate 1. On the lowest insulating film 2 are formed lower wiring strips 3 and 4 which are different in width from each other. Namely, the lower wiring strip 3 is narrower than the wiring strip 4, and is spaced apart from the wider wiring strip 4. The wiring strips 3 and 4 thus different in width are covered with an inter-level insulating film 5 deposited through a CVD (chemical-vapor-deposition) stage, and a coated insulating film 6 is provided on the entire surface of the inter-level insulating film 5. As will be seen from FIG. 1, a valley is formed between the wiring strips 3 and 4, and the valley is filled up with the coated insulating film 6. However, the coated insulating film 6 has a flat top surface, and, for this reason, the coated insulating film 6 is varied in thickness along the configuration underneath the film 6. Subsequently, an etch-back technique is applied to the coated insulating film 6, and the coated insulating film 6 is uniformly decreased in thickness through the etch-back stage. As a result, a part of the coated insulating film 6 located on the top surface of the wiring strip 3 is fairly removed, however, the coated insulating film 6 is partially left in the valley between the wiring strips 3 and 4. On the entire surface of the structure is deposited an insulating film 7 by using the CVD technique, and through holes 8 and 9 are formed through the insulating film 7 as well as the interlevel insulating film 5, exposing the top surfaces of the wiring strips 3 and 4. Though not shown in the drawings, upper metal wiring strips are formed on the insulating film 7, and the upper metal wiring strips are brought into contact with the lower wiring strips 3 and 4 through the holes 8 and 9, respectively.

However, a problem is encountered in the prior art semiconductor device in that the metal wiring strip tends to be eroded after a relatively short service time period. Efforts had been made by the inventor for providing a solution of the problem, and the inventor found that the coated insulating film 6 is liable to remain on the top surface of the wider wiring strip 4 after the etch-back stage, because the coated insulting film 6 tends to have a relatively large thickness on the wider wiring strip 4. Since the coated insulating film 6a thus left on the lower wiring strip 4 is exposed to the through hole 9, undesirable erosive gas such as vapor is produced from the coated insulating film 6a exposed in the hole 9 during the deposition of the metal wiring and for the subsequent heat treatment steps. The undesirable erosive gas attacks the upper metal wiring strip, and, for this reason, the metal wiring is eroded by the gas.

If, on the other hand, the etch-back stage is adjusted to a relatively long time period for perfectly removing the coated insulating film 6a, the inter-level insulating film 5 on the narrower wiring strip 5 is over-etched so that the narrower wiring strip 3 is liable to be exposed. The over-etching is further causative of production of a recess in the coated insulating film in the valley, and the recess deteriorates the smooth topography.

SUMMARY OF THE INVENTION

It is therefore an important object of the present invention to provide the structure of a semiconductor device metal wiring strips of which are less liable to be eroded in a long service time period.

It is also an important object of the present invention to provide a process of fabricating the semiconductor device which is free from the problems inherent in the prior art process.

To accomplish these objects, the present invention proposes to surround a contact area of the wide wiring strip by forming a plurality of moats.

In accordance with one aspect of the present invention, there is provided a multi-level semiconductor structure forming a part of a semiconductor device, comprising: a) a lower insulating film; b) a plurality of lower wiring strips including a narrow wiring strip and a wide wiring strip and formed on the lower insulating film; c) an inter-level insulating film structure covering the narrow wiring strip and the wide wiring strip; d) an upper level insulating film covering the inter-level insulating film structure, contact holes being formed through the upper level insulating film and the inter-level insulating film structure for exposing the narrow wiring strip and the wide wiring strip, respectively; and e) upper metal wiring strips respectively projecting through the contact holes and reaching a contact area of the narrow wiring strip and a contact area of the wide wiring strip, respectively, in which a plurality of moats are formed in the wide wiring strip for surrounding the contact area of the wide wiring strip.

In accordance with another aspect of the present invention, there is provided a process of fabricating a multi-level semiconductor structure, comprising the steps of: a) preparing a lower insulating film; b) depositing a lower conductive film on the lower insulating film; c) patterning the lower conductive film for forming a plurality of lower wiring strips including a narrow wiring strip and a wide wiring strip, a plurality of moats being simultaneously formed in the wide wiring strip for partially surrounding a contact area; d) depositing a first insulating film on the entire surface; e) coating the first insulating film with a second insulating film for creating a flat top surface; f) uniformly removing the second insulating film for exposing the first insulating film on respective contact areas of the narrow and wide wiring strips; g) depositing an upper insulating film on the entire surface; h) forming contact holes in the upper and first insulating films for exposing the contact areas of the narrow and wide wiring strips; i) depositing a metal on the entire surface, the metal filling the contact holes; and j) patterning the metal for forming upper metal wiring strips respectively contacting the contact areas of the narrow and wide wiring strips.

BRIEF DESCRIPTION OF THE DRAWINGS

The features and advantages of the structure of a semiconductor device and a process of fabricating thereof according to the present invention will be more clearly understood from the following description taken in conjunction with the accompanying drawings in which.

DESCRIPTION OF THE PREFERRED EMBODIMENTS

First Embodiment

Figure 1:
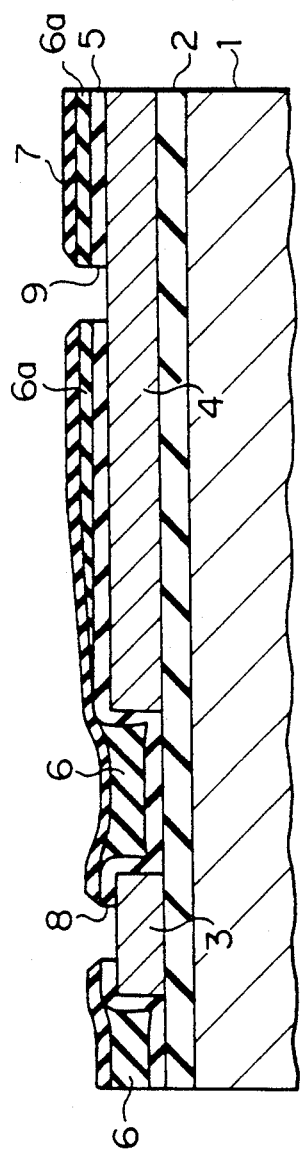
FIG. 1 is a cross sectional view showing the structure of a prior art semiconductor device fabricated through a prior art fabricating process.
Figure 2:
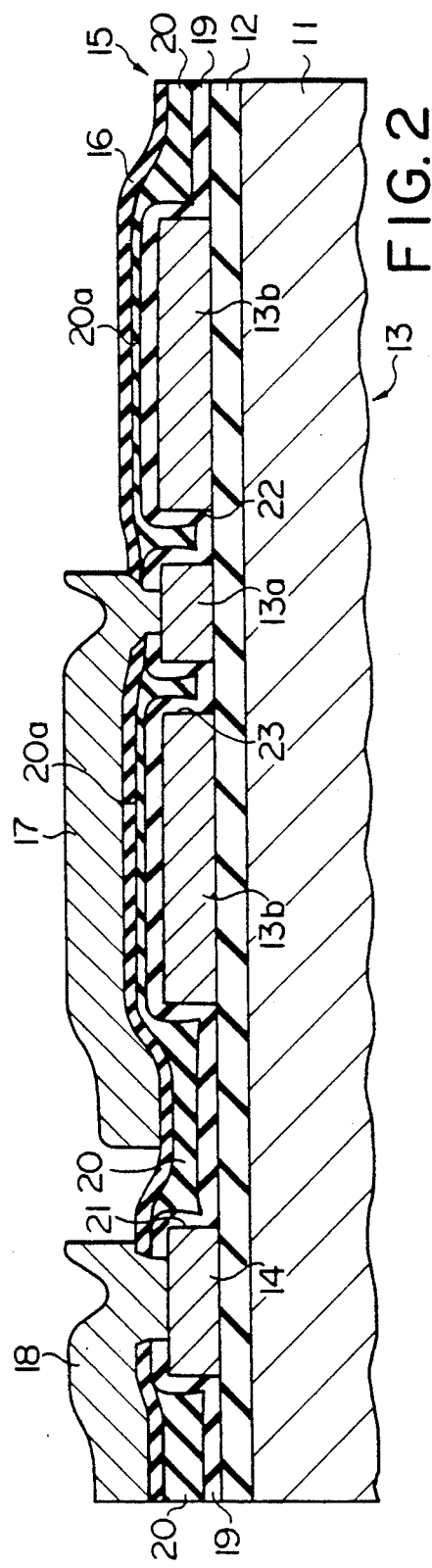
FIG. 2 is a cross sectional view showing a multi-level structure of a part of a semiconductor device embodying the present invention.

Referring first to FIG. 2 of the drawings, a multi-level structure forming a part of a semiconductor device is fabricated on a semiconductor substrate 11, and largely comprises the lowest insulating film 12 grown on the major surface of the substrate 11, lower wiring strips 13 and 14 of, for example, aluminum formed on the lowest insulating film 12, an inter-level insulating film structure 15 covering the lower wiring strips 13 and 14, an upper insulating film 16 provided on the inter-level insulating film structure 15 and metal wiring strips 17 and 18 of, for example, an aluminum formed on the upper insulating film 16 and connected to the lower wiring strips 13 and 14, respectively. The lower wiring strip 14 is relatively small in width, and serves as a signal propagating line of an integrated circuit, however, the wider wiring strip 13 is used as a ground line for supplying the ground voltage to the component elements of the integrated circuit. The wider wiring strip 13 may be used as a power supply line for supplying a power voltage level (Vcc, Vee etc). Of course, a large number of the component elements are fabricated on the semiconductor substrate together with various signal and voltage lines, however, these elements and lines are not shown in the drawings, because the present invention is understandable without those component elements and lines.

In this instance, the inter-level insulating film structure consists of a first insulating film 19 deposited by using a chemical vapor deposition technique and a second insulating film 20 provided on parts of the first insulating film 19 by using a spin-coating technique. The lower wiring strips 13 and 14 are spaced from each other, and a gap 21 takes place therebetween. The gap 21 is filled with the second insulating film 20 for providing a smooth topography for the upper metal wiring strips 17 and 18. Although no second insulating film 20 is left on the lower wiring strip 14, the second insulating film 20a remains on the top surface of the lower wiring strip 13 because of the large width thereof.

Figure 3:
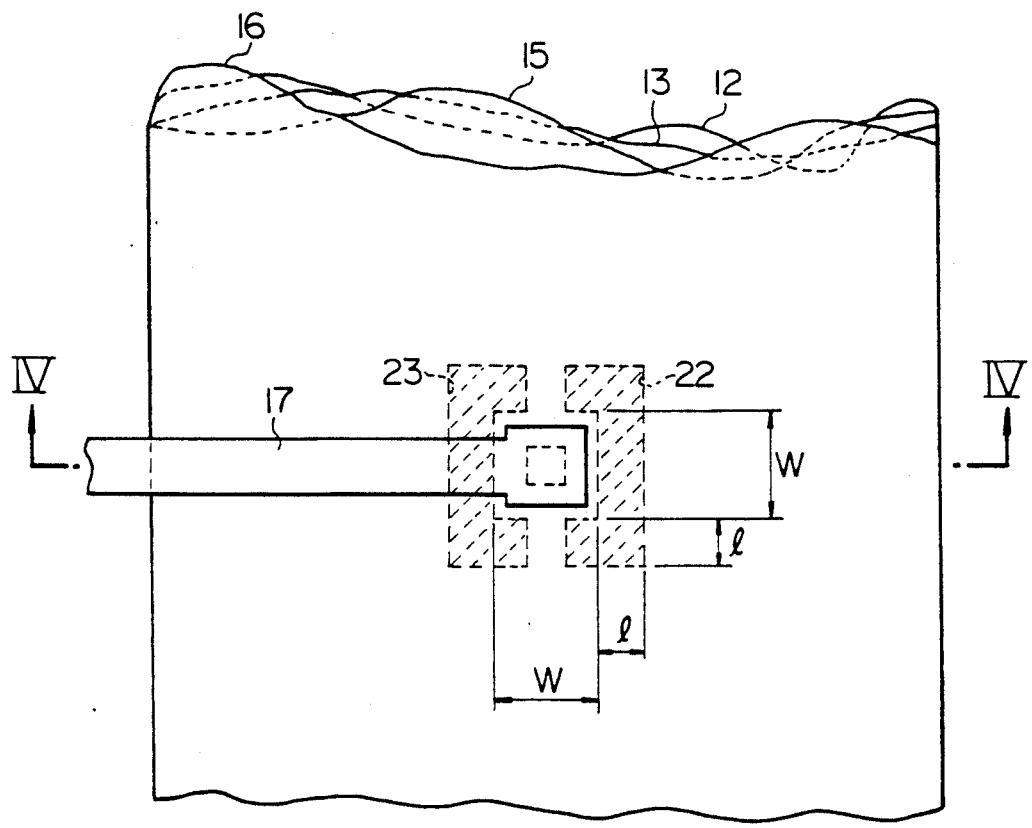
FIG. 3 is a plan view showing a part of the semiconductor device shown in FIG. 2.

As will be seen from FIG. 3, moats (indicated by hatched lines) 22 and 23 are formed in the lower wiring strip 13, and partially surround a contact area 13a of the lower wiring strip 13. The contact area 13a is much smaller in the width than the peripheral area 13b of the lower wiring strip 13, so that no second insulating film 20 is left on the contact area 13a.

Figure 4A:
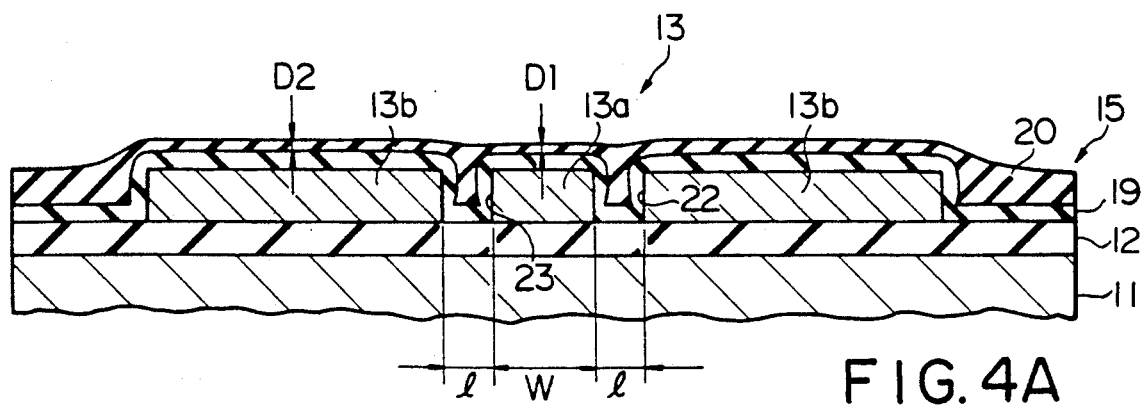
FIGS. 4A to 4C are cross sectional views taken along the line IV in FIG. 3 and showing the process sequence through which the structure of the semiconductor device is fabricated according to the present invention.
Figure 4B:
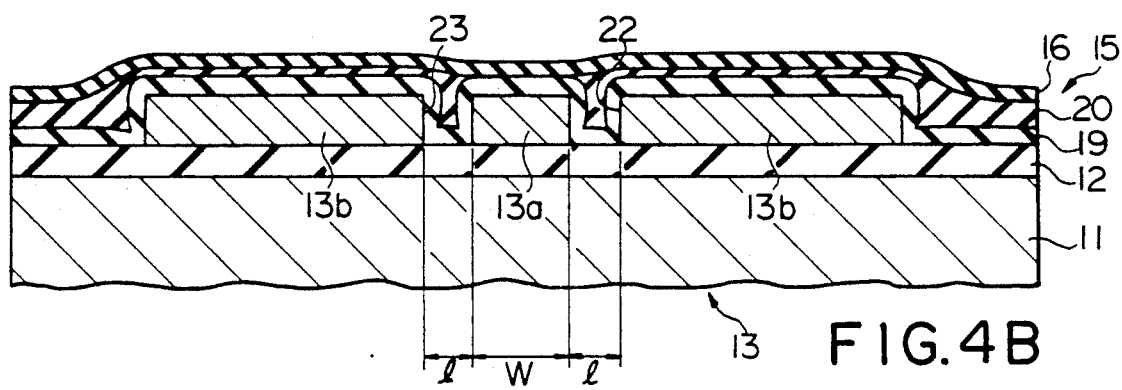
Figure 4C:
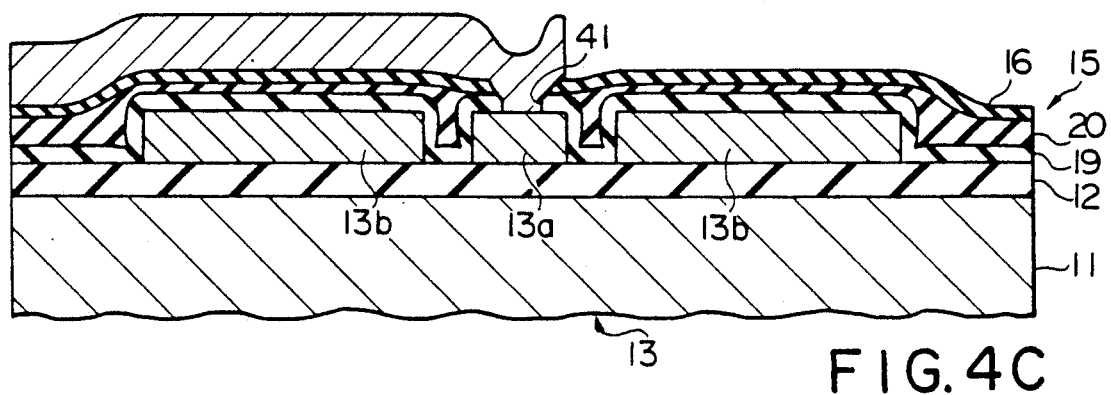

Description will be hereinbelow made for a process of fabricating the multi-level semiconductor structure with reference to FIGS. 4A to 4C. One of the particular features of the present invention is the moats formed in the wide wiring strip 13, and, for this reason, the description is focused on the wide wiring strip 13 only. The process sequence starts with preparation of the substrate 11 covered with the lowest insulating film 12, and a conductive material such as, for example, an aluminum is deposited on the entire surface of the lowest insulating film 12. Subsequently, a lithographic process is applied to the conductive film, and the conductive film is patterned to form the narrow wiring strip, the wide wiring strip 13 and the contact area 13a surrounded by the moats 22 and 23. Although the optimum width of each moat is dependent to the viscosity of solution spun coated for the second insulating film 20 as well as the thickness of the second insulating film 20, each of the moats 22 and 23 is about 2.0 microns to about 3.0 microns in width l. The width w of contact area 13a ranges from about 3.0 microns to about 8.0 microns. If the width w is less than 3.0 microns, the contact area is too small to provide a good electrical conduct. The width w less than 8.0 microns effectively achieves the advantages of the present invention.

After the pattern formation, an insulating material such as, for example, a silicon oxide is deposited on the entire surface of the structure for formation of the first insulating film 19. In this instance, the lower wiring strips range between about 0.5 micron and about 1.0 micron in thickness, and the first insulating film 19 is regulated to be about 0.2 micron to about 0.5 micron in thickness. After the deposition, a solution of an insulating material such as, for example, an inorganic silicon compound or an organic silicon compound is spun onto the entire surface of the structure, thereby being formed into the second insulating film 20. The second insulating film 20 fills the gap between the lower wiring strips as well as the moats, and is stacked on the top surfaces of the first insulating film 19 to create a smooth flat surface. The second insulating film 20 is as thick as about 0.2 micron to 0.3 micron at the flat top surfaces of the first insulating film. In this instance, the insulating material for the second insulating film 20 is a silica film or silicon lader polymer, and the viscosity thereof is fallen within a range between about 5 centi poise and about 10 centi poise. The spinning revolution speed is adjusted to about 2000 rpm to 4000 rpm. The structure is placed in an nitrogen ambient at about 300 degrees to about 400 degrees in centigrade for about 30 minutes. The essential part of the resultant structure of this stage is shown in FIG. 4A.

As described hereinbefore, the thickness of the second insulating film 20 tends to be increased by increasing the width of the wiring strips thereunder. Since the contact area 13a is mostly surrounded by the moats 22 and 23, the contact area 13a is substantially decreased in the effective width, and, accordingly, the second insulating film 20 is decreased in the thickness over the contact area 13a. In fact, the thickness D1 is smaller than the thickness D2 over the peripheral area of the wide wiring strip 13b.

Subsequently, an etch-back operation is carried out to uniformly decrease the second insulating film 20 until portions of the first insulating film 19 on the narrow wiring strip and the contact area 13a are exposed, however, the second insulating film 20 is left on the peripheral area 13b of the wide wiring strip due to the relatively large thickness of the second insulating film 20. In this instance, a reactive ion etching is employed to achieve the uniform removing, and a gaseous mixture of $CF_4$ and $H_2$ is used in the etching.

The etch-back stage is followed by the formation of the upper insulating film 16. Namely, an insulating material such as, for example, the silicon oxide is deposited to a thickness ranging from about 0.2 micron to about 0.5 micron by using the chemical vapor deposition technique as shown in FIG. 4B.

The lithographic techniques are applied to the upper insulating film 16 and the inter-level film structure 15 again, and contact holes including a contact hole 41 by using a mask (not shown) are formed and expose the top surface of the lower wiring strips, respectively. The contact hole 41 exposes the contact area 13a, and no second insulating film is exposed to the contact hole 41. On the entire surface of the structure a metal such as, for example, an aluminum is deposited to form a metal film by using a sputtering technique, and the metal film is selectively etched and patterned to form upper wiring strips including the upper metal wiring strip 17 which is brought into contact with the contact area 13a through the contact hole 41. Since no second insulating film is exposed to the contact hole 41, the undesirable erosive gas is never produced during the deposition stage of the metal followed by the patterning stage. This results in that the wiring strips can provide a long service time period without any serious disconnection.

Second Embodiment

Figure 5:
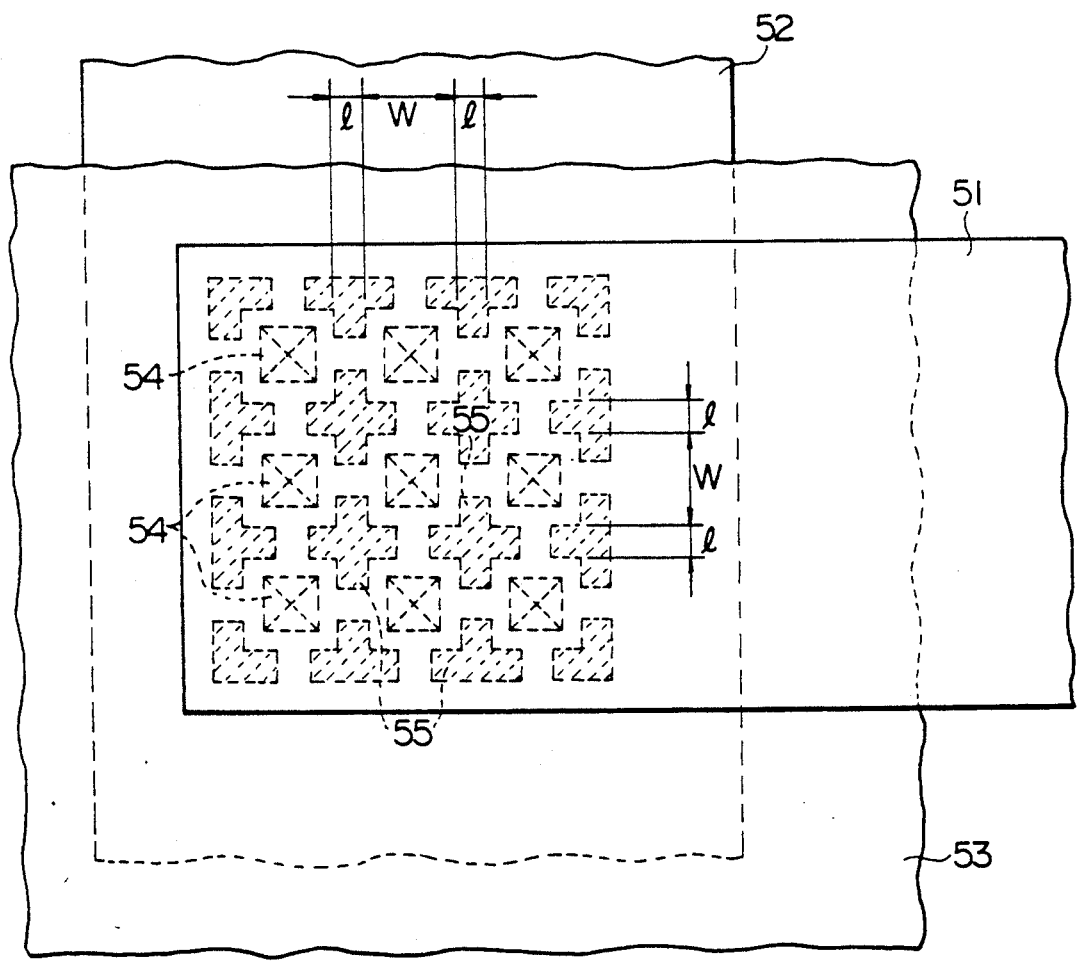
FIG. 5 is a plan view showing the structure of another multi-level semiconductor structure embodying the present invention.

Turing to FIG. 5, another upper metal wiring strip 51 is in contact with a lower wiring strip 52 through a plurality of contact holes formed in an inter-level film structure 53. The contact holes 54 are respectively marked with boxes filled with respective Xs, and are surrounded by a plurality of moats 55 which are formed in the lower wiring strip 52 and indicated by hatched lines. Since the metal wiring strip 51 is brought into contact with the lower wiring strip 52 through the plural contact holes, the amount of contact area is drastically increased, and, for this reason, a large amount of current is allowed to flow between the upper metal wiring strip 51 and the lower wiring strip 52.

Although particular embodiments of the present invention have been shown and described, it will be obvious to those skilled in the art that various changes and modifications may be made without departing from the spirit and scope of the present invention.

What is claimed is:

1. A multi-level semiconductor structure forming a part of a semiconductor device, comprising:
    a) a lower insulating film;
    b) a plurality of lower wiring strips including a narrow wiring strip and a wide wiring strip and formed on said lower insulating film;
    c) an inter-level insulating film structure covering said narrow wiring strip and said wide wiring strip;
    d) an upper level insulating film covering said inter-level insulating film structure, contact holes being formed through said upper level insulating film and said inter-level insulating film structure for exposing said narrow wiring strip and said wide wiring strip, respectively; and
    e) upper metal wiring strips respectively projecting through said contact holes and reaching a contact area of said narrow wiring strip and a contact area of said wide wiring strip, respectively, in which a plurality of moats are formed in said wide wiring strip for surrounding the contact area of said wide wiring strip.

2. A multi-level semiconductor structure as set forth in claim 1, in which said inter-level insulating film structure has a first insulating film covering said narrow wiring strip and said wide wiring strip and a second insulating film provided in a gap between said narrow wiring strip and said wide wiring strip as well as on a peripheral area of said wide wiring strip.

3. A multi-level semiconductor structure as set forth in claim 2, in which said plurality of moats consist of first and second moats having respective straight portions located on opposite sides of said contact area and extending in parallel to each other and respective projecting portions projecting from ends of the straight portions and confronted with one another.

4. A multi-level semiconductor structure as set forth in claim 3, in which each of said moats has a width ranging from about 2.0 microns to about 3.0 microns.

5. A multi-level semiconductor structure as set forth in claim 2, in which the contact area of said wide wiring strip has a plurality of contact sub-areas each partially surrounded by some of said plurality of moats.

6. A multi-level semiconductor structure as set forth in claim 5, in which said contact sub-areas are arranged in rows and columns.

7. A multi-level semiconductor structure as set forth in claim 1, in which the contact area of said wide wiring strip is surrounded by peripheral side edges each ranging from about 3.0 microns to about 8.0 microns.

8. A multi-level semiconductor structure as set forth in claim 1, in which said plurality of moats consist of first and second moats having respective straight portions located on opposite sides of said contact area and extending in parallel to each other and respective projecting portions projecting from ends of the straight portions and confronted with one another.

* * * * *